United States Patent [19]

Kertis

[11] Patent Number: 5,181,205
[45] Date of Patent: Jan. 19, 1993

[54] SHORT CIRCUIT DETECTOR CIRCUIT FOR MEMORY ARRAYS

[75] Inventor: Robert A. Kertis, Puyallup, Wash.

[73] Assignee: National Semiconductor Corporation, Santa Clara, Calif.

[21] Appl. No.: 507,692

[22] Filed: Apr. 10, 1990

[51] Int. Cl.$^5$ .................. G11C 11/40; G11C 29/00
[52] U.S. Cl. .................. 371/21.1; 365/201; 324/522
[58] Field of Search ........... 365/201; 371/21.1; 324/522

[56] References Cited

U.S. PATENT DOCUMENTS

| 4,048,575 | 9/1977 | Musa | 330/253 |
|---|---|---|---|
| 4,284,957 | 8/1981 | Haque | 330/253 |
| 4,685,086 | 8/1987 | Tran | 365/200 |
| 4,720,818 | 1/1988 | Takeguchi | 365/201 |
| 4,728,898 | 3/1988 | Staley, Jr. | 324/522 |
| 4,905,194 | 2/1990 | Ohtsuka et al. | 365/201 |
| 4,969,124 | 11/1990 | Luich et al. | 365/201 |

FOREIGN PATENT DOCUMENTS 0003198  1/1990  Japan .................. 371/21.1

Primary Examiner—Robert W. Beausoliel, Jr.
Assistant Examiner—Allen M. Lo
Attorney, Agent, or Firm—Irving S. Rappaport; Robert C. Colwell; Jeanne C. Suchodolski

[57] ABSTRACT

A method for detecting voltage supply short circuits in integrated circuits and a circuit for implementing that method is disclosed. Entire rows of memory cells in an SRAM are coupled to a single sense line. The sense line to each row is activated individually. The sense lines are in turn coupled to a current sensing circuit. If a short exists on any memory cell in a given row, the current sensing circuit generates a low output, indicating a short circuit.

9 Claims, 3 Drawing Sheets

SHORT CIRCUIT DETECTOR CIRCUIT FOR MEMORY ARRAYS

BACKGROUND OF THE INVENTION

1. Field of the Invention

This invention relates to Static Random Access Memories ("SRAMs"). In particular, it relates to a circuit which can be incorporated into a SRAM to simplify the detection of power supply short circuits within arrays of SRAM memory cells.

2. Description of the Relevant Art

A generic SRAM memory cell is shown in FIG. 1a. The construction and operation of such cells is known. In the illustrated cell, transistor $T_1$ is the driver and transistor $T_3$ the load for an inverter that is cross-coupled to a second inverter formed from transistors $T_2$ and $T_4$, the two inverters forming a storage flip-flop. When transistor $T_2$ is on and transistor $T_1$ is off, output Q is a logic 1 (herein, +5 V). With the row-select line low (0 V), transistors $T_5$ and $T_6$ are off, and the cell is isolated from both bit lines. When the memory cell is read, as soon as the row-select line goes high (+5 V), transistors $T_5$ and $T_6$ couple the bit lines to the cell and output Q appears on bit line D.

As shown in FIG. 1b, a sense amplifier is connected to the bit line to provide output buffering, and the proper logic level appears on the sense output line. In a write operation, the selected row of cells is connected to the bit lines, and Q or $\overline{Q}$ is set or reset by a logic 1 (+5 V) placed on bit line D or $\overline{D}$ by the write amplifiers while a logic 0 (0 V) is placed on the complement bit line. In this SRAM with nondestructive readout, the state of the flip-flop persists as long as power is supplied to the chip, and it is not altered by the read operation. It should be understood that an SRAM chip will comprise many thousands of such memory cells.

In normal operations, transistors $T_1$ and $T_2$ have a certain amount of capacitance, shown in FIG. 1a as capacitors $C_1$ and $C_2$. If $V_{dd}$ were shorted to $V_{ss}$, due to a manufacturing error, a certain amount of time would be required before the charge present on either $C_1$ and $C_2$ (the nature of the flip-flop requires that either Q or $\overline{Q}$ be high (+5 V), but not both) is drained through transistors $T_3$ and $T_4$ to $V_{ss}$. This discharge time is often large in comparison to the amount of time required to access the memory cell and the frequency of such access. It is therefore quite possible to read data several times from a cell with such a short circuit before the charge is dissipated sufficiently to detect the presence of the short.

This long dissipation time makes testing for this type of short circuit a long, tedious and costly process. A method and/or an apparatus which can speed the process of testing for and detecting such power supply short circuits is needed.

SUMMARY OF THE INVENTION

The present invention provides a method to test an array of SRAM memory cells for power supply short circuits. It also provides a circuit for detecting such short circuits in conjunction with the testing method. According to one embodiment, each row of memory cells is individually activated and scanned. Each row select line is coupled to a common current sense line, which in turn is coupled to a current sense circuit. In operation, each successive row of memory cells is activated. If the voltage supply ($V_{dd}$) for that row of cells is shorted to ground ($V_{ss}$) or any lower voltage for any reason a current will flow through the current sense line and will be detected by the current sense circuit.

The circuit which selects individual rows of memory cells for testing also provides a means for uniquely identifying the memory chip. Certain fuses within the select circuit can be selectively blown, the pattern of open fuses providing the identification information.

The present invention will now be described in detail with reference to the following figures.

DETAILED DESCRIPTION OF THE PREFERRED EMBODIMENTS

Figure 1A:
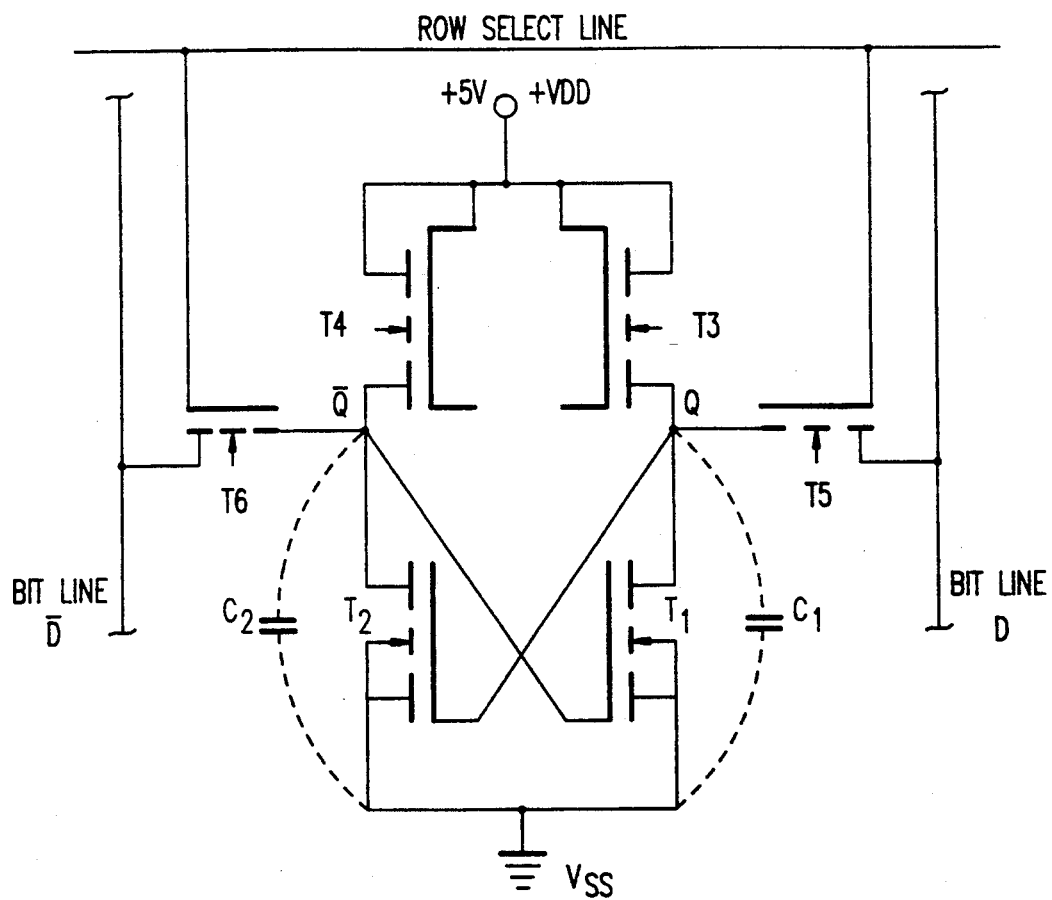
FIG. 1a shows a typical SRAM memory cell.
Figure 1B:
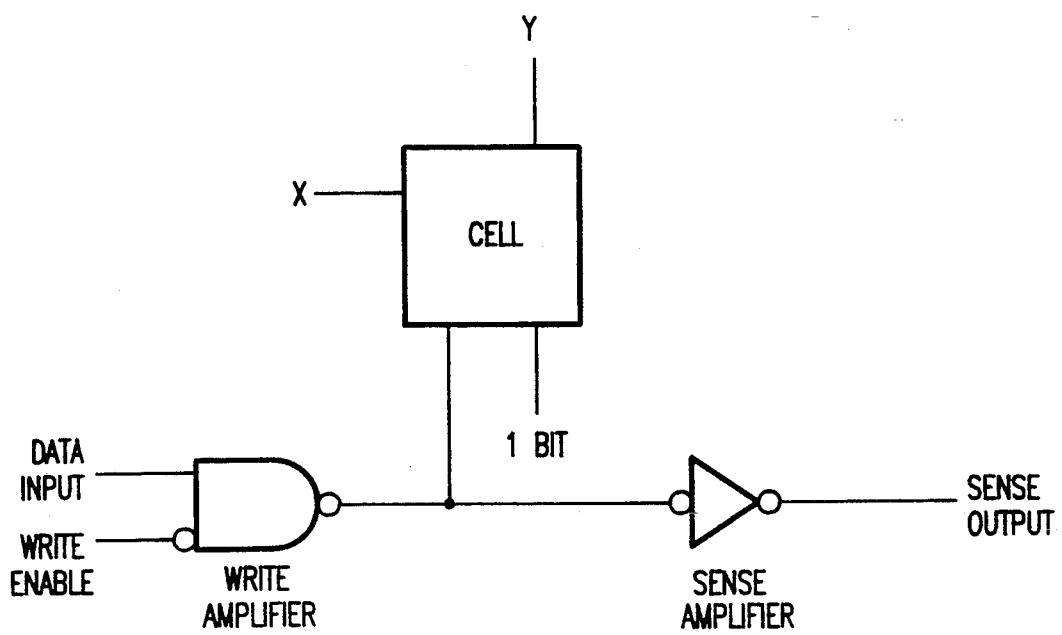
FIG. 1b shows the write and sense amplifiers coupled to the cell.
Figure 2:
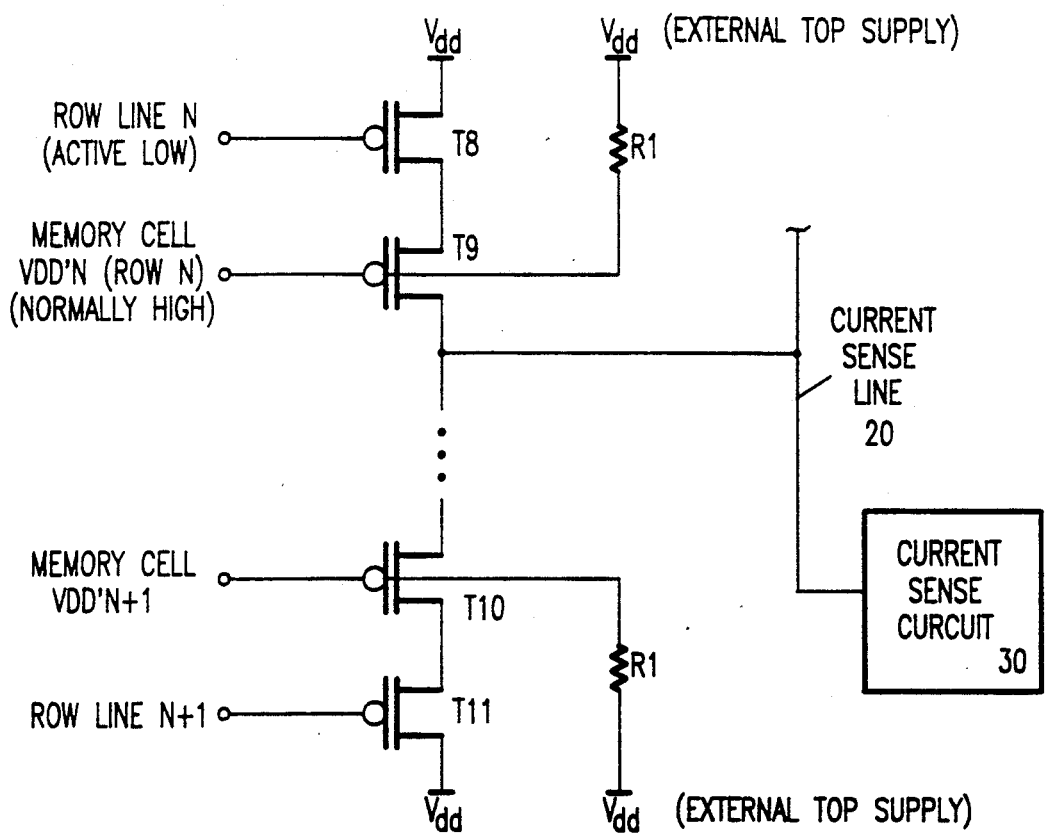
FIG. 2 shows the current sense row selector circuit.

FIG. 1a shows how each prior art SRAM memory cell is individually coupled to a row select line and to $V_{dd}$, herein, by example only, +5 V. In the present invention, as shown in FIG. 2, the SRAM cell receives $V_{dd}'$, $V_{dd}$ being first coupled to $R_1$ which resistor limits the amount of current which can flow through the voltage supply lines to the memory cell. Each cell is coupled to a row line, shown in FIG. 2 as row lines N and N+1. As the particular workings of the memory cells is not relevant to an understanding of the present invention, the cells are not illustrated in FIG. 2. For the purposes of this description, it suffices to state that each cell is coupled to the current sense row selector circuit shown in FIG. 2 by means of the memory cell's row select line and its $V_{dd}'$ voltage supply line. There can be any arbitrary number of rows of memory cells.

Row line N and memory cell supply $V_{dd}'N$ are coupled respectively to the gates of PMOS transistors $T_8$ and $T_9$. Similarly, the gates of transistors $T_{10}$ and $T_{11}$ are coupled respectively to memory cell supply $V_{dd}'N+1$ and row line N+1.

In this type of SRAM array, voltage supply $V_{dd}'$ to the cell can be inadvertently shorted to either $V_{ss}$ or, possibly, to a row line which is active low (0 V) as a result of a manufacturing defect. Such short circuits can be detected by using this invention in a test mode. When the present invention is used in its test mode, each consecutive row of memory cells is scanned. When a row becomes active (row N, for example), PMOS transistor $T_8$ turns on. If $V_{dd}'$ is shorted low for any reason, transistor $T_9$ will also turn on. Current will then flow through current sense line 20 (FIG. 2) to current sense circuit 30. The current sense circuit, as will be explained, detects even small current flows through the current sense line when the SRAM is being tested. It outputs a logic signal to indicate if such a flow is detected.

Figure 3:
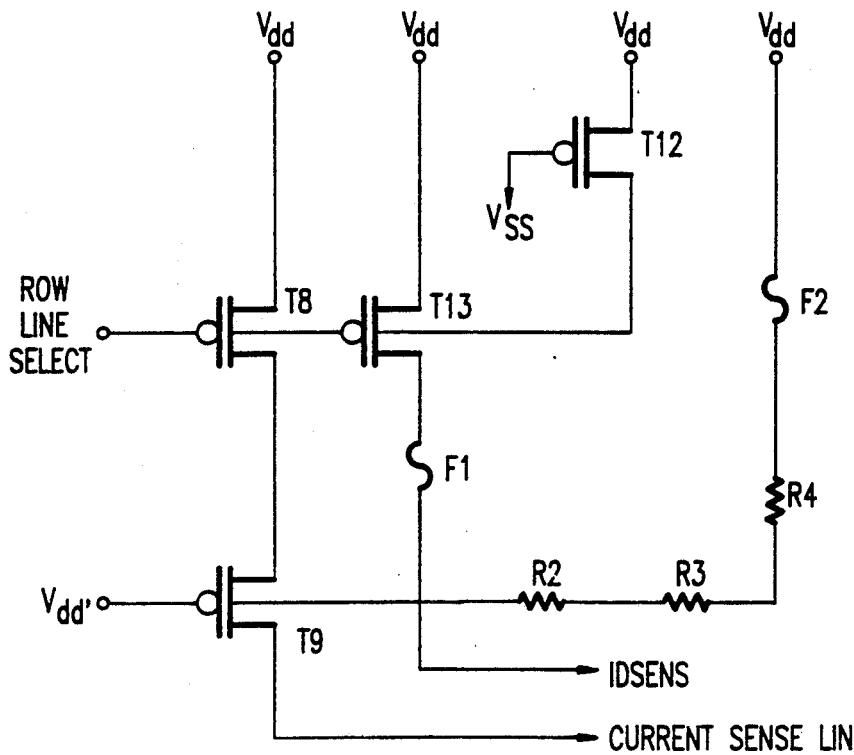
FIG. 3 is a detailed schematic of the row selector circuit.

A detailed schematic of the row select circuit is shown in FIG. 3. As discussed, transistors $T_8$ and $T_9$, whose gates are respectively coupled to the row select signal and $V_{dd}'$, the isolated memory matrix supply voltage, act to detect shorts in the matrix between $V_{dd}'$ and either $V_{ss}$ or the row select signal, which is active low. This is done by selecting a particular row, whereby that row's select signal goes low and transistor $T_8$ turns on. It will be obvious to those skilled in the art that selection of a particular row occurs in response to commands received from a computer to which the SRAM is coupled. Further, it is to be understood that each row select line is coupled to the current detector circuit 30 in response to signals generated by the computer coupled to the SRAM. If $V_{dd}'$ is low, the result of a short circuit, transistor $T_9$ will turn on and current will flow along current sense line 20 to current sensing circuit 30 (FIG. 2) during the supply short circuits test mode. Transistor $T_{12}$ is a pull-up transistor for the row select signal which maintains a high voltage level of $V_{dd}$ for nonselected row select lines.

Another feature of the row select circuit is that it provides a circuit ID encoding scheme. This is done in a similar fashion to the voltage supply short circuit test. The row select signal selects the appropriate row. If fuse $F_1$ is not open, current will flow through the IDSENS signal line. There is one fuse per row of memory cells and it can be blown or not blown to encode the chip lot and wafer number or other desired information. Resistors $R_2$, $R_3$ and $R_4$ are used to isolate the memory cell top supply $V_{dd}'$ from the external supply $V_{dd}$. Doing so limits the current that can flow if a short circuit occurs to approximately 1 ma. If fuse $F_2$ opens, the flow of current stops completely.

Figure 4:
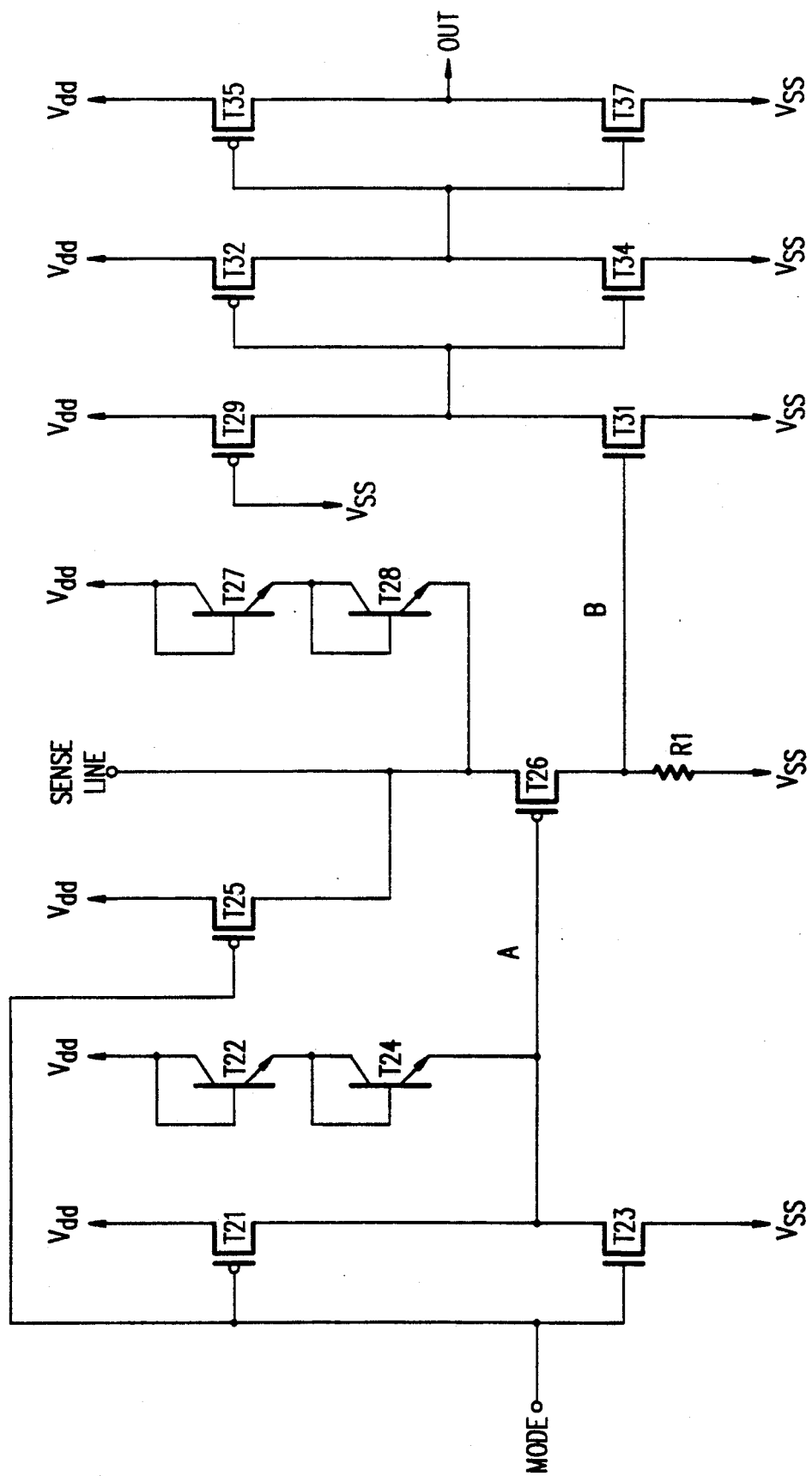
FIG. 4 is a detailed schematic of the current sensing circuit.

A detailed schematic drawing of current sensing circuit 30 is shown in FIG. 4. The MODE signal is used to turn the sensing circuit on during test mode. In the test mode, node A is set at $V_{dd} - 2 V_{be}$ (transistor $T_{22}$ and $T_{24}$ providing the requisite 2 $V_{be}$ drops) as a reference voltage level for the gate of PMOS transistor $T_{26}$. $T_{26}$ serves as a cascode device coupled to the bottom rail of circuit 30.

When not in the matrix voltage supply short circuit test mode, the MODE signal is low. Transistor $T_{23}$ is off and transistor $T_{21}$ is on, holding node A at the supply voltage $V_{dd}$. In turn, transistor $T_{26}$ turns off, allowing resistor $R_1$ to hold node B low. Transistor pairs $T_{29}/T_{31}$, $T_{32}/T_{34}$ and $T_{35}/T_{37}$ act as inverters so when node B is low, the output ('OUT') of the circuit is high.

In the test mode, the MODE signal is high. This turns off transistors $T_{21}$ and $T_{25}$ and turns transistor $T_{23}$ on. With transistor $T_{23}$ on, node A is biased to $V_{dd} - 2V_{be}$, the voltage drop through $T_{22}$ and $T_{24}$. Node B will change voltage as current modulation occurs along the current sense line 20 signal in test mode. When current is sensed, node B will rise, tripping the three inverters that drive the OUT output signal. The beta ratio for the first inverter ($T_{29}/T_{31}$) is low to allow node B, which has a small voltage swing, to trip the three inverters. Bipolar transistors $T_{27}$ and $T_{28}$ are used to clamp the low level voltage to a certain minimum on the current sense line 20 signal line to prevent SENSLINE voltage from coupling around. Transistor $T_{26}$ will clamp the high level of the current sense line 20 signal to $V_{dd} - 2V_{be} + V_{tp}$.

Although the present invention has been described in the specific environment of a BiCMOS SRAM, its utility is not limited thereto. Its use in any type of SRAM or even in a dynamic random access memory is easily envisioned. Therefore, this application should not be read in a limited sense.

I claim:

1. A circuit for detecting voltage supply short circuits in an array of static random access memory cells, said cells being arranged in rows and each row selectable in response to a signal on a row select line, said cells having a memory matrix voltage supply derived from an external power supply, said circuit comprising:
   a first and second transistor, for each row of said cells, coupled in a series, the gates of said first and second transistor coupled respectively to said row select line and to said memory matrix voltage supply, the source of said first transistor coupled to said external power supply, and the drain of said first transistor coupled to the source of said second transistor;
   a current sense line coupled to the drain of said second transistor;
   a current detector circuit coupled to said current sense line for generating a logic output signal in response to current flow along said current sense line; and
   means for selectively biasing each of said first transistors in a conductive state and for activating said detector circuit such that in response to an improper voltage on said memory matrix voltage supply corresponding when the voltage at said second circuit node rises above a predefined value.

2. A circuit for detecting short circuits in a static random access memory, said memory comprising a plurality of memory cells, each memory cell having a row select input coupled to a row select line and a connection to a power supply, said memory cells arranged in rows and all memory cells in a common row coupled to the same row select line by said row select inputs, said circuit comprising:
   first transistor means having their sources connected to said power supply and their gates connected individually to successive row select lines;
   second transistor means having their sources connected to the drain of said first transistor means, their gates coupled to said power supply, and their drains connected to a current sense line; and
   current sensing circuit means, for detecting when current flows through said current sense line;
   computer means for selecting one of said row select lines and for activating said current sensing circuit means so that an improper voltage level on the gate of said second transistor means permits current to flow on said current sense line.

3. The circuit of claim 2 wherein there is one pair of first and second transistor means for each row of memory cells.

4. The circuit of claim 2 wherein the first and second transistor means comprise PMOS transistors.

5. The circuit of claim 2 wherein the first and second transistor means comprise NMOS transistors.

6. The circuit of claim 2 wherein said current sensing circuit means comprises:
   a first switching network coupled to a first circuit node, said first switching network being coupled to receive an input signal, said first switching network biasing said first circuit node to the power supply voltage when said input signal is at a first logic level and biasing said first circuit node to a lower voltage when said input signal is at a second logic level;
   current sensing means, coupled to said current sense line, said first circuit node and said second circuit node, for conducting current from said current sense line when said input signal is at the second level, the voltage at said second circuit node increasing as increasing current flows through said current sensing means; and inverter means coupled to said second circuit node, for outputting a signal when the voltage at said second circuit node rises above a predefined value.

7. The circuit of claim 6 wherein said inverter output circuit further comprises three inverter logic gates coupled together in series.

8. A circuit for detecting voltage supply short circuits in an array of static random access memory cells, said cells being arranged in rows and each row selectable in response to a signal on a row select line, said cells having a memory matrix voltage supply derived from an external power supply, said circuit comprising:

a first and second transistor, for each row of said cells, coupled in a series, the gates of said first and second transistor coupled respectively to said row select line and to said memory matrix voltage supply, the source of said first transistor coupled to said external power supply, and the drain of said first transistor coupled to the source of said second transistor;

a current sense line coupled to the drain of said second transistor;

a current detector circuit coupled to said current sense line for generating a logic output signal in response to current flow along said current sense line; and means for selectively biasing each of said first transistor sin a conductive state and for activating said detector circuit such that in response to an improper voltage on said memory matrix voltage supply corresponding when the voltage at said second circuit node rises above a predefined value;

an encoding circuit means for encoding information identifying said array of static random access memory cells coupled in parallel with said first transistor for each row of said cells.

9. The circuit of claim 8 wherein said encoding circuit means comprises:

a sense signal line an a transistor having its drain coupled to said external power supply, its gate coupled to said row select line and its source coupled to a fuse element; said fuse element having either a low or a high impedance such that upon selection of a corresponding one of said row select lines, a current will flow along said sense signal line if said fuse has a low impedance and substantially no current will flow along said sense signal line if said fuse has a high impedance.

* * * * *